US007771650B2

(12) United States Patent   (10) Patent No.: US 7,771,650 B2
Ng et al.   (45) Date of Patent: Aug. 10, 2010

(54) MATERIAL AND USES THEREOF

(75) Inventors: Wei Beng Ng, Singapore (SG); Akio Takada, Singapore (SG)

(73) Assignee: Sony Corporation, Tokyo (JP)

( * ) Notice: Subject to any disclaimer, the term of this patent is extended or adjusted under 35 U.S.C. 154(b) by 701 days.

(21) Appl. No.: 11/338,351

(22) Filed: Jan. 24, 2006

(65) Prior Publication Data

US 2006/0180884 A1   Aug. 17, 2006

(30) Foreign Application Priority Data

Jan. 25, 2005   (SG) .............................. 200500445-2

(51) Int. Cl.
C22C 19/07   (2006.01)
(52) U.S. Cl. ........................ 420/435; 257/421; 428/812; 428/832.1
(58) Field of Classification Search ................ 428/812, 428/832.1; 420/435; 257/421
See application file for complete search history.

(56) References Cited

U.S. PATENT DOCUMENTS 5,242,728 A * 9/1993 Mizukami ................ 428/836.3
5,560,786 A * 10/1996 Shin et al. .................... 148/313

FOREIGN PATENT DOCUMENTS

KR   2005104772 A   * 11/2005

OTHER PUBLICATIONS

N. V. Myung et al., Electrodeposited Hard Magnetic Thin Films for Mems Applications, 6th International Symposium on Magnetic Materials, Processes and Devices, Proc. Electrochem. Soc. PV 2000-29 (2000).*

* cited by examiner

*Primary Examiner*—Kenneth A Parker
*Assistant Examiner*—Jose R Diaz
(74) *Attorney, Agent, or Firm*—Frommer Lawrence & Haug LLP; William S. Frommer; Thomas F. Presson (57) ABSTRACT

A material comprising cobalt (Co), platinum (Pt) and phosphorus (P) having a composition of 94-98 wt % Co, 0-1 wt % Pt and 2-4 wt % P. The material may be subjected to annealing at a temperature between 100 and 500 degrees Celsius. The material is formed by electroplating a substrate in a suitable electrochemical bath. The electroplated CoPtP material forms a layer on the substrate. The CoPtP material has enhanced perpendicular magnetic properties and may be advantageous for use in microelectromechanical system (MEMS) devices.

11 Claims, 6 Drawing Sheets

MATERIAL AND USES THEREOF

FIELD OF THE INVENTION

The present invention relates to a material comprising cobalt (Co), platinum (Pt) and phosphorus (P) and also to uses thereof. For example, the material may be used in devices such as microelectromechanical system (MEMS) devices.

BACKGROUND TO THE INVENTION

Thin film cobalt-platinum (CoPt) and cobalt-platinum-phosphorus (CoPtP) alloys have been known as potential perpendicular recording materials for use in hard disk drives due to their high magnetocrystalline anisotropy and magnetic saturation. Specifically, an ordered phase of $Co_{50}Pt_{50}$ shows very high coercivities (>10 kOe). Besides application in the magnetic recording industry, recently CoPt-based materials have been assessed to have huge potential for application in microelectromechanical systems (MEMS) due to their high energy-product as required by magnetic microactuators. The energy-product indicates the energy that a magnetic material can supply to an external magnetic circuit when operating at any point on the material's demagnetisation curve. MEMS technology has made use of semiconductor manufacturing technology for the fabrication of micro- and nano-devices.

Usually, thin films (sub-micrometer) of cobalt-platinum are fabricated by vacuum deposition processes. However, the operating cost of a vacuum deposition process may be high. Recently, electroplating is being used as an alternative method.

Attempts have been made to fabricate Co-based films using electroplating processes, the thickness of the film usually having been limited to a thickness of less than 10 μm. Further, the thermal stability of the films has not been previously investigated. The thermal stability of films is essential in assessing the possible use of the films in various devices, especially MEMS devices. In particular, the film has to be of sufficient thickness to meet the requirement of the MEMS device it is to be used in.

In view of the above considerations, there is a need to develop a new material of sufficient thermal stability and one which is capable of thick film deposition by a suitable method.

An object of the present invention is to address the problems set out above.

SUMMARY OF THE INVENTION

According to a first aspect, the present invention provides a material comprising cobalt (Co), platinum (Pt) and phosphorus (P) having a composition of 94-98 wt % Co, 0-1 wt % Pt and 2-4 wt % P.

At least certain embodiment of the present invention provides a material which is suitable for electroplating on a microelectromechanical system (MEMS) device.

The material may be a magnetic material. In particular, the composition may have a composition of 96.3 wt % Co, 0.6 wt % Pt and 3.1 wt % P.

The material may be subjected to annealing at a temperature between 100 and 500 degrees Celsius. The annealing may be carried out at ambient atmosphere. The annealed material may have enhanced perpendicular magnetic properties. Examples of the enhanced properties include the material's perpendicular coercivity, remanent magnetisation and/or squareness of the material.

According to a second aspect, the present invention provides a substrate and a material according to the first aspect of the invention, wherein the material may be electroplated onto the substrate to form a layer thereon. The thickness of the layer may vary. Preferably, the thickness is at least 0.5 μm. The substrates may be glass substrates. The substrates may be sputtered with a seed layer. The seed layer may comprise a layer of gold (Au) on a layer of chromium (Cr) (herein denoted as Cr/Au seed layer). The gold layer of the Cr/Au seed layer may have a (111) crystallographic orientation.

An advantage of electroplating the material is that it offers selective area deposition in comparison to "line-of-sight" conformal deposition by other processes such as vacuum processes. Further, electroplating has fast deposition rates involving simple equipment set-up and the control of process parameters is easier.

According to a third aspect, the present invention provides a method of electroplating a material according to the first aspect of the invention, the method comprising the steps of:
(a) providing an electrochemical bath;
(b) providing the substrate; and
(c) electroplating the material onto the substrate in the electrochemical bath.

The substrate may comprise a seed layer comprising a layer of gold (Au) on a layer of chromium (Cr) (herein denoted as Cr/Au seed layer). The gold layer of the Cr/Au seed layer may have a (111) crystallographic orientation.

The electroplating may be carried out at a current density of between 10 and 40 mA/cm$^2$. Preferably, the electroplating is carried out at 25 mA/cm$^2$. Preferably, the current density remains constant when the electroplating is taking place. This may be achieved by using a galvanostat.

The method may further comprise the step of: (d) subjecting the material to annealing at a temperature between 100 and 500 degrees Celsius. The annealing may be carried out at ambient temperature.

The electrochemical bath may have a composition comprising one, more or all of: 0.01-0.10 mol/liter of $Co^{2+}$ ions, 0.01-0.10 mol/liter of $PtCl_6^{2-}$ ions and 0.01-0.50 mol/liter of $H_2PO_3^-$ ions. Preferably, the electrochemical bath has a composition comprising one, more or all of: 0.025 mol/liter of $Co^{2+}$ ions, 0.025 mol/liter of $PtCl_6^{2-}$ ions and 0.072 mol/liter of $H_2PO_3^-$ ions. The electrochemical bath may further comprise other ions in the form of any one or a combination of boric acid, sodium chloride, dodecyl sulphate and saccharin.

The electrochemical bath may be at a temperature of between 15 and 40 degrees Celsius. In particular, it may be at a temperature of 20 degrees Celsius. The pH of the bath may be between 2.0 and 5.0. In particular, the pH of the bath may be 4.5.

The electroplating may be carried out using a rotating disk electroplating (RDE) system. Preferably, the electroplating is carried out under a rotational agitation of between 100 and 1000 rpm. Even more preferably, the electroplating is carried out under a rotational agitation of 500 rpm.

The material may be used in microelectromechanical system (MEMS) devices, especially MEMS devices that make use of electromagnetic interaction for achieving microactuation.

According to a forth aspect, the invention provides a MEMS device comprising the material defined herein. For example, the MEMS device may be a magnetic device. In particular, it may be a microgripper.

According to a fifth aspect, the invention provides a MEMS device operable to grip an object between gripping parts thereof, the device including field generation means operable to set up a magnetic field and the device arranged such that at least one of the gripping parts is moveable relative to at least one other of the gripping parts under the influence of that field.

The field generation means may be operable to set up a magnetic field when a potential difference is connected thereacross. The field generation means may include at least one coil formed from an electrical conductor. The field generation means may be supported on a body of the MEMS device.

At least one of the gripping parts may comprise a magnetiseable material arranged to interact with the magnetic field and to cause the at least one gripping part that comprises the magnetiseable material to move relative to the at least one other gripping part. The magnetiseable material may form a coating on the or each gripping part.

The MEMS device may comprise two gripping parts, each gripping part moveable with respect to the other and each gripping part comprising the magnetiseable material.

The device may comprise two coils, each may be arranged to set up a respective field, each field interacting with the magnetic material of a respective one of the gripping parts.

The device may have at least one gripping part attached to the body of the MEMS device by a resiliently flexible structure, for the movement relative thereto. In particular, the at least one gripping part is supported so as to be adjacent to and spaced from the at least one coil of the device. The resiliently flexible structure may be a flat, torsion spring. The resiliently flexible structure may support the respective gripping part so as to be cantilevered from the body of the MEMS device.

At least one gripping part may be coated with or provided with a material arranged to promote grip between the gripping parts and an object gripped therebetween.

The magnetiseable material may be the material according to the first aspect.

BRIEF DESCRIPTION OF THE DRAWINGS

A specific embodiment of the present invention is now described by way of example only and with reference to the accompanying drawings, in which.

SPECIFIC DESCRIPTION OF A PREFERRED EMBODIMENT

The following experiments have been performed in which a layer of a material embodying the invention was produced by electroplating and then tested.

Electroplating occurs by the process of electrodeposition. Electrodeposition is the process of producing a coating, usually metallic, on a surface of an object by the action of electric current. The deposition of a metallic coating onto an object is achieved by putting a negative charge on the object to be coated and immersing it into a solution which contains a salt of the metal to be deposited (i.e. the object to be coated is made the cathode of an electrolytic cell). The solution is referred to as an electrolyte, also commonly termed an electrochemical bath. The electrochemical bath is a specially designed chemical solution that contains the desired metal ions. A power source provides the necessary current needed for the electroplating process.

Firstly, a suitable electrochemical bath for use for electroplating a material was prepared by dissolving the chemicals listed in Table 1 in deionised water. The chemicals were added in the sequence listed.

TABLE 1

Chemical composition of electrolyte

| Chemicals | Chemical Formulae | Concentration (mM) |
|---|---|---|
| Boric Acid | $B(OH)_3$ | 400 |
| Sodium Chloride | $NaCl$ | 400 |
| Cobalt Chloride | $CoCl_2.6H_2O$ | 25 |
| Sodium Hexachloroplatinate (IV) Hexahydrate | $Na_2PtCl_6.6H_2O$ | 25 |
| Sodium Hydrogenphosphite 2.5 water | $NaH_2PO_3.2.5H_2O$ | 72 |
| Dodecyl Sulfate (Sodium Salt) | $C_{12}H_{25}NaO_4S$ | 0.035 |
| Saccharin (Sodium based) | $C_7H_4NNaO_3S.2H_2O$ | 4 |

Circular glass substrates were then obtained. Each substrate was 12 mm in diameter. The glass substrates were sputtered with a seed layer comprising a layer of gold (Au) (200 nm) on a layer of chromium (Cr) (20 nm) (herein denoted as Cr/Au seed layer). The sputtered substrates were ultrasonically cleaned using trichloroethylene and ethanol. A conducting silver paste was applied onto the back-side and side-wall of the glass substrates at two opposite points so that an electrode of the electroplating system may be connected electrically to the gold layer of the Cr/Au seed layer on the substrates. The electroplating system used was a rotating disk electroplating (RDE) system. Further, the surface of the gold of the Cr/Au seed layer was activated using sulphuric acid.

The substrates were subsequently fixed to a cathode of the electroplating system by means of a holder covering the rim of the substrates. Platinum wire was used as the anode for the electroplating system. An Ag/AgCl electrode was used as the reference electrode which was connected to the plating solution via a salt bridge. A reference electrode is an electrode that has a known and stable equilibrium electrode potential. It is used as a reference point against which the potential of other electrodes (typically that of the working electrode or measuring electrode) can be measured in an electrochemical cell.

The exposed area of plating was over a central circular area of 10 mm diameter. Electrochemical deposition was carried out at room temperature (about 20° C.) by an electrical circuit which applied a current density of 25 mA/cm² between the anode and the cathode via a galvanostat. A galvanostat was used to ensure that constant current was provided. The pH of the electrochemical bath was adjusted to 4.5 using sulphuric acid and sodium hydroxide prior to electroplating. In order to ensure that the electroplating was uniform and reproducible, the plating was carried out under a rotational agitation speed of 500 rpm for a period of 10 minutes.

As a result of the electroplating, a layer of cobalt (Co)—platinum (Pt)—phosphorus (P) (CoPtP) was formed on the glass substrates sputtered with the Cr/Au seed layer. In particular, the substrates (on which the CoPtP layer was deposited) were rotated during the electroplating process.

After the electroplating was completed, an X-ray diffraction (XRD) was carried out on the glass substrates with the sputtered Cr/Au seed layer electroplated with a layer of CoPtP. The XRD spectrum (FIG. 2) was compared to the XRD spectrum carried out on the plain glass substrates with the sputtered Cr/Au seed layer before they were electroplated with the layer of CoPtP (FIG. 1).

Figure 1:
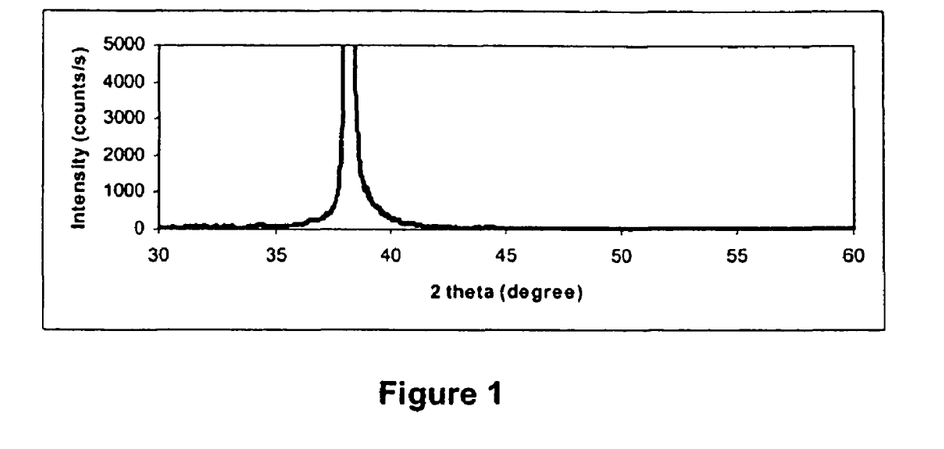
FIG. 1 is a graph showing the X-ray diffraction (XRD) spectrum of glass substrate with sputtered chromium (Cr) and gold (Au) seed layer.
Figure 2:
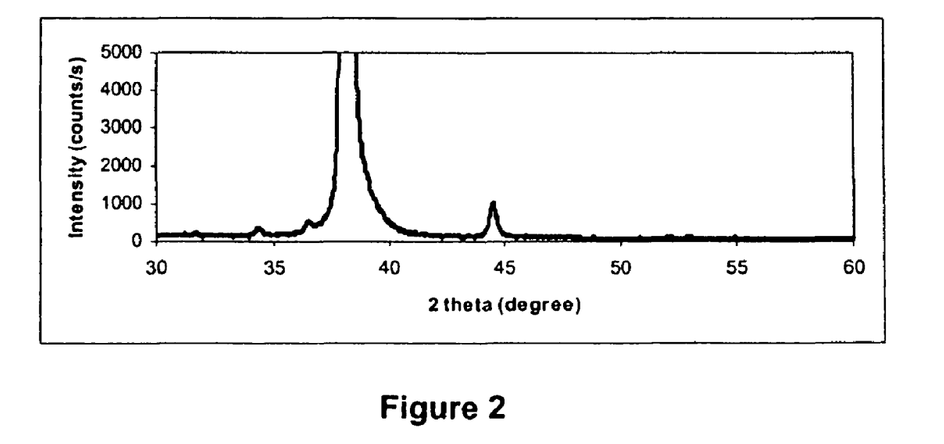
FIG. 2 is a graph showing the X-ray diffraction (XRD) spectrum of electroplated cobalt (Co)—platinum (Pt)—phosphorus (P) film on glass substrate with sputtered chromium (Cr) and gold (Au) seed layer.

As can be seen in FIG. 1, there is only one prominent peak at $2\theta$ approximately equal to 38°, corresponding to the reflection from Au (111) crystallographic orientation. FIG. 2 shows an additional peak observed at $2\theta$ approximately equal to 44.5°, which corresponds to the reflection peak from the hexagonal close-pack (hcp) Co (002) crystallographic orientation.

Figure 3:
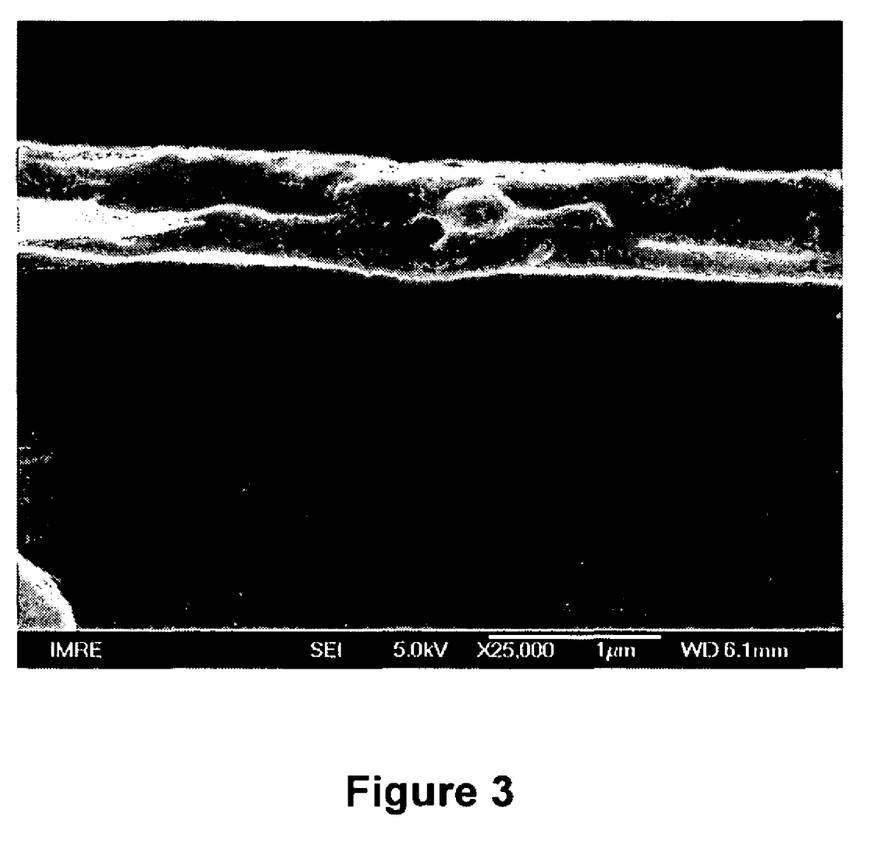
FIG. 3 is a scanning electron micrograph (SEM) showing the cross-section of the plated cobalt (Co)—platinum (Pt)—phosphorus (P) film.

A scanning electron micrograph (SEM) of the cross-section of the electroplated glass substrates was taken. The SEM is shown in FIG. 3. It is observed that the layer of the electroplated material has an average thickness 0.6 μm.

Further, an elemental analysis of the electroplated layer was carried out by inductively-coupled plasma (ICP). It revealed a composition of 96.3 wt % Co, 0.6 wt % Pt and 3.1 wt % P.

Figure 4:
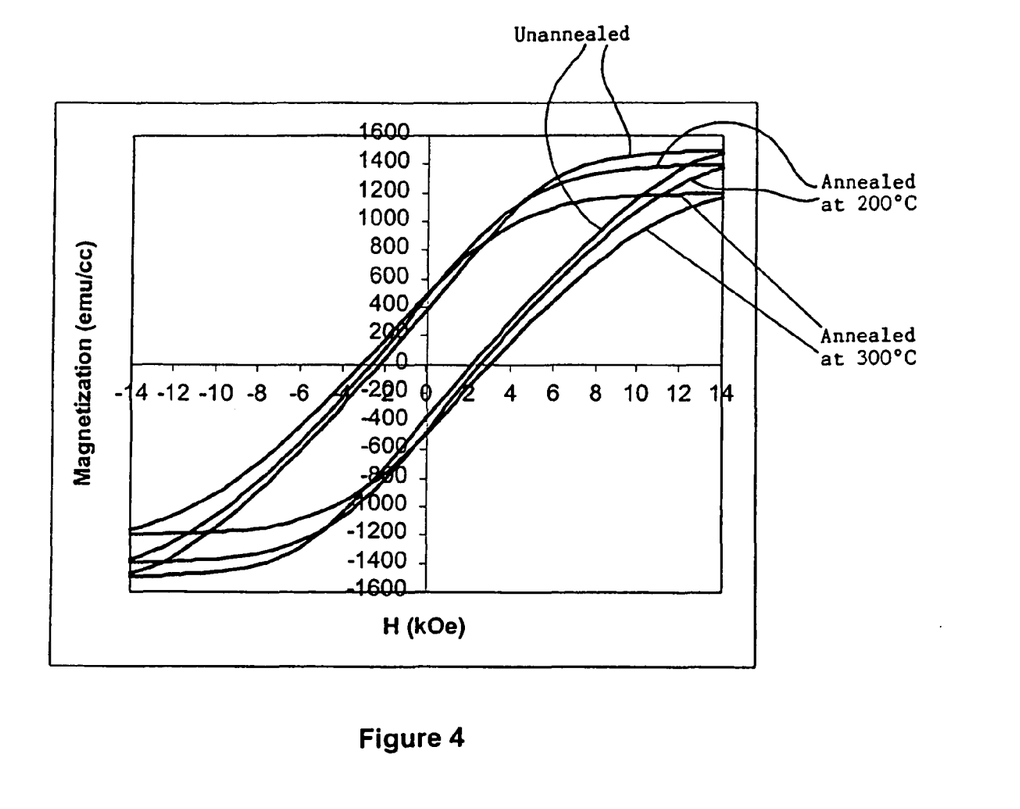
FIG. 4 is a graph showing the out-of-plane hysteresis curves of electroplated cobalt (Co)—platinum (Pt)—phosphorus (P) film before and after annealing at 200° C. for 2 hours in ambient atmosphere.

The magnetic properties of the layer was also determined by using a vibrating sample magnetometer (VSM). In particular, the properties of the electroplated CoPtP layer was determined after subjecting a first example of the substrate with the layer thereon to annealing at 200° C. and subjecting a second example of the substrate with the layer thereon to annealing at 300° C., each for 2 hours in ambient atmosphere. The properties of each were also determined prior to subjecting the layer to annealing. FIG. 4 shows the out-of-plane M-H hysteresis curves of the CoPtP layer before and after being subjected to annealing. The properties measured were perpendicular coercivity (Hc), remanent magnetisation (Mr), saturation magnetisation (Ms) and squareness (S) of the layer. A summary of the properties measured is shown in Table 2.

TABLE 2

Perpendicular magnetic properties of un-annealed and annealed CoPtP layer

| Annealing Temperature (° C.) | Annealing Duration (h) | Ms (emu/cc) | Mr (emu/cc) | Hc (Oe) | S |
|---|---|---|---|---|---|
| Unannealed | Unannealed | 1497.09 | 378.78 | 2191.77 | 0.25 |
| 200 | 2 | 1394.69 | 479.54 | 2595.19 | 0.34 |
| 300 | 2 | 1191.94 | 485.89 | 3039.51 | 0.41 |

Coercivity (Hc) is the measure of the strength of a magnetic field. It is usually measured in Oersteds (Oe). A low coercivity denotes that a material is easy to magnetise and/or demagnetise, while a high coercivity denotes that a material is harder to magnetise and/or demagnetise.

Remanent magnetisation (Mr) refers to the strength of the magnetic field that is set up by an object after it has been exposed to a strong magnetic field. Alternatively, it can be said that the remanent magnetisation is a measure of the ability of a material to retain a magnetic field.

Saturation magnetisation (Ms) is achieved when an increase in magnetic field strength does not cause an increase in the intrinsic magnetic induction of the material. The saturation magnetisation usually decreases with an increase in temperature.

Squareness (S) is defined as a ratio of the remanent magnetisation to the saturation magnetisation of a material (i.e. Mr/Ms).

The above-mentioned properties are related in that the remanent magnetisation is the permanent magnetisation that remains after the external filed is removed. If the external field is reduced further, the remanent magnetisation will eventually be removed. The external field for which the remanent magnetisation goes to zero is referred to as the coercivity.

As can be seen from Table 2, there is an increase in the perpendicular Mr, Hc and S with increasing annealing temperature. It is observed that annealing induces a decrease in Ms of the layer, leading to a lateral broadening of the hysteresis curve and hence, a higher Hc is obtained. The unannealed electroplated CoPtP layer shows high vertical magnetic anisotropy of vertical Mr and Hc at 378.78 emu/cc and 2191.77 Oe respectively. The layer exhibits thermal stability when annealed up to 300° C. in ambient atmosphere with an improvement in perpendicular Mr and Hc to 485.89 emu/cc and 3039.51 Oe respectively.

These results indicate the possibility of using such layers formed by electroplating for the fabrication of MEMS devices, in particular, magnetic MEMS devices.

The CoPtP layer that was fabricated by electroplating may be applicable for many MEMS devices that make use of electromagnetic interaction to achieve microactuation. Examples of MEMS devices in which the CoPtP layer may be used include microgrippers, micromirrors and micropumps.

Figure 5:
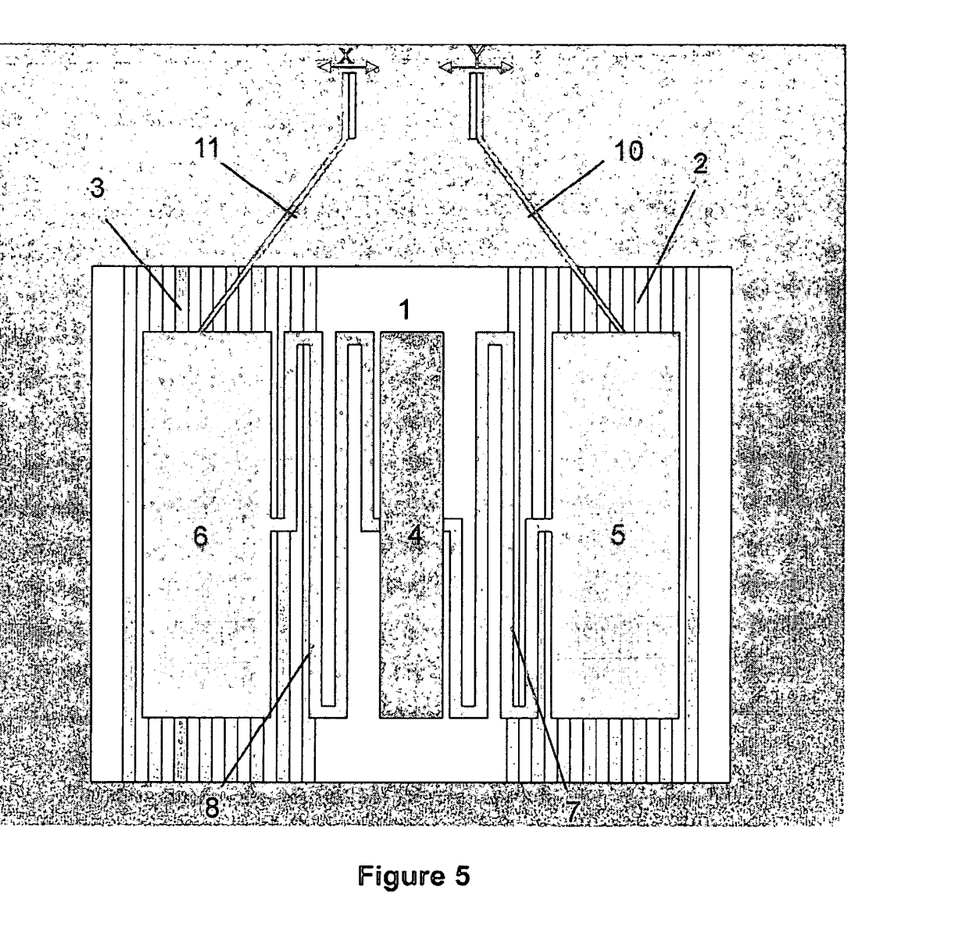
FIG. 5 is a schematic diagram showing the top view of a microgripper.
Figure 6:
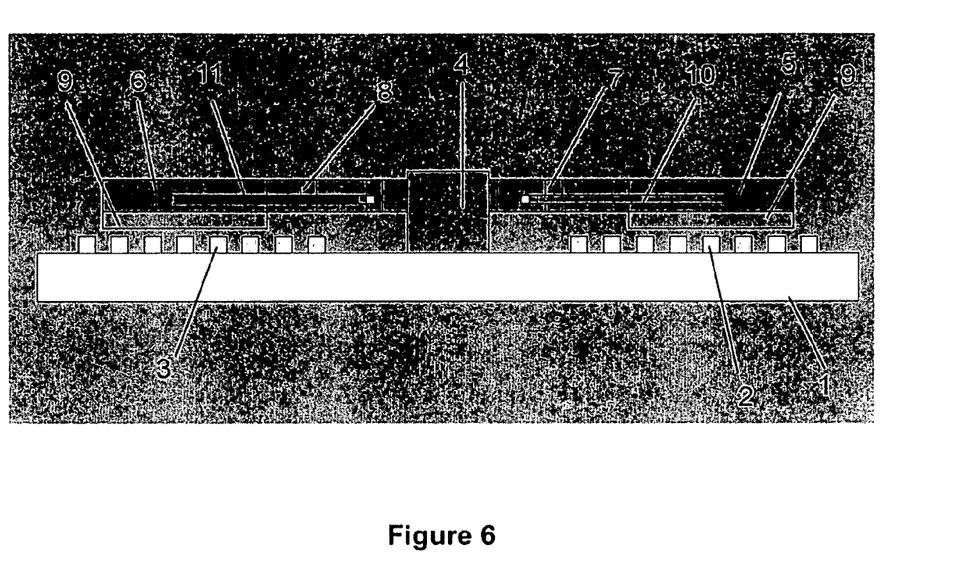
FIG. 6 is a schematic diagram showing the side view of the microgripper.
Figure 7:
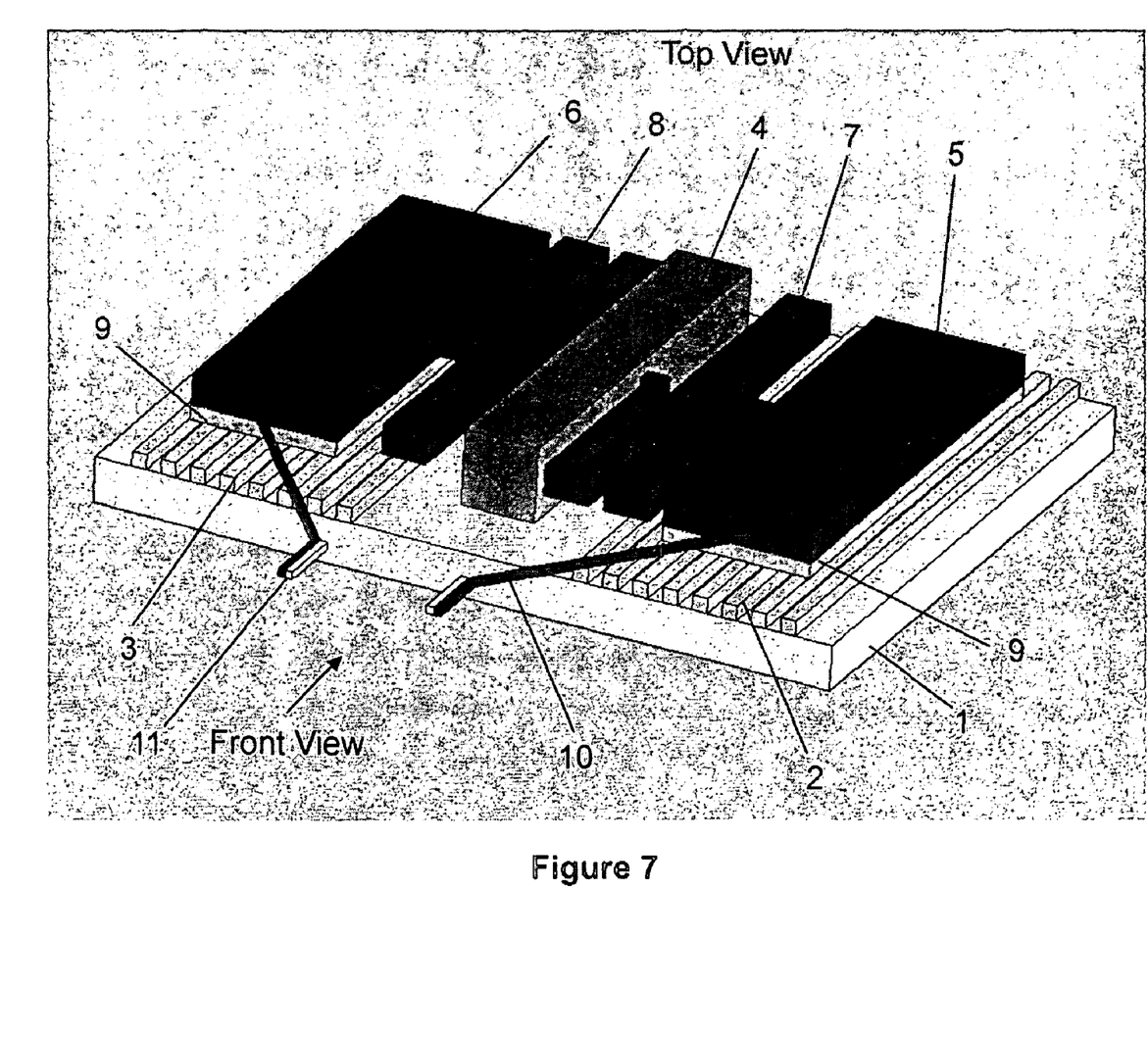
FIG. 7 is a schematic diagram showing a perspective view of the microgripper.

A possible structure of a microgripper device is shown in FIGS. 5, 6 and 7, which shows the top, side and perspective views respectively. A microgripper is a mechanical device that grasps microscopic objects. Essentially, it has two roles. It may be used as a tool to assemble micromachines or as the hands of microrobots. In either case, the microgripper has fingers to grasp objects and an actuator to bring about movement of the fingers.

The device includes a base 1 that acts as a base for other components of the device. The base 1 is planar and is rectangular. Two coils 2,3 are wound onto the base 1, with a respective coil being positioned at each end of the base 1. A gap exists between the coils 2,3 in the middle of the base 1, and between the two ends thereof. A pedestal 4 is mounted on the base 1 in the gap between the two coils 2,3. The pedestal is a right-rectangular block, with its major dimension extending across the surface of the base 1, perpendicular to the length of the base 1.

A respective platform 5,6 projects to each side of the pedestal 4 and so as to lie above a respective one 2,3 of the coils. The arrangement is such that there is a gap between each platform 5,6 and the coil 2,3 above which it projects. The platforms 5,6 are generally planar and lie in the same plane, that plane being parallel to the plane of the base 1. The face of each platform 5,6 that is adjacent the substrate is coated with the magnetic material 9 described hereinabove.

Each platform 5,6 is joined to the respective adjacent side of the pedestal 4 by a respective flexible structure 7,8. Each flexible structure 7,8 is arranged to bend about an axis that is normal to the plane of the base 1, but to support its respective platform 5,6 above the base 1 and the respective adjacent coil 2,3 wound thereon. In this embodiment, each flexible structure takes the form of an elongate member that has the appearance of being folded back on itself repeatedly so as to have a number of adjacent and concertinaed layers, all of which are co-planar with the platforms 5,6. Each flexible structure has four layers: two longer layers that are the length of the pedestal 4 and of the platforms 5,6, and two shorter layers that are approximately half that length. The shorter layers are outermost with the longer layers sandwiched therebetween. For each flexible structure 7,8 one or the shorter layers is attached to the pedestal 4 and the other is attached to the respective adjacent platform 5,6. The flexible structures 7,8 differ from one another, however, by each being arranged with its shorter layers adjacent a different end of the pedestal 4.

A respective finger 10,11 is attached to and projects from an end of each platform 5,6, those ends projecting in the same direction as the ends of the pedestal 4 and perpendicular to the ends of the base 1. The fingers 10,11 project away from the platforms 5,6 and towards one another, such that free ends of the fingers are closer than their ends that are fixed to the platforms 5,6. The free end of each the finger 10,11 is oblique with respect to the remainder of that finger 10,11 such that those free ends are parallel to one another. Each free end is coated with, or may otherwise be provided with, a material arranged to promote grip between the fingers and an item that is to be gripped therebetween.

Together, each platform 5,6 and the respective finger 10,11 attached thereto may be considered to form a respective gripping part.

In operation, an electric current is caused to flow in each of the coils 2,3. This results in a respective magnetic field being set up around each coil 2,3. The magnetic fields interact with the magnetic material 9 on the platforms 5,6 and exert a force on each of the platforms 5,6. The arrangement of the flexible members 7,8 results in these forces causing substantially rotational movement of the platforms 5,6 about an axis perpendicular to the plane of the base 1 such that the free ends of the fingers 10,11 come together and grip an item placed therebetween. This rotational movement is against the action of the flexible members 7,8. If the electric currents cease to flow in the coils, the associated fields are not longer set up and so exert no force on the platforms 5,6. The actions of the flexible members 7,8 therefore result in the fingers 10,11 moving back to their previous positions. Thus, each flexible structure 7,8 is a flat spring that serves to support the respective adjacent platform 5,6 relative to the pedestal 4 so as to be cantilevered.

As described above, the CoPtP layer has enhanced magnetic properties and therefore only a thin layer may be needed to generate a magnetic field of sufficient strength to interact with current in coils 2, 3 so as to create sufficient Lorenz force to move platforms 5, 6 and hence cause the extension arms 10, 11 to act as grippers. The CoPtP layer acts as a permanent magnet and is magnetised as a magnet before it is used in the microgripper.

From the foregoing, it will be appreciated that the CoPtP layer is an attractive candidate for many MEMS devices since many processes involve certain annealing steps and the properties of the CoPtP layer are enhanced with annealing.

The described exemplary embodiments and experiments should not be construed as being limiting in nature. For example, although the experiment described conducting the electroplating at room temperature (about 20° C.), other temperatures are also envisaged. Preferably, however, the electroplating is conducted at temperatures below 30° C. Further, although the embodiments describe a microgripper as an application example, it will be apparent that the present invention may also be used in other devices such as other micro-devices.

The invention claimed is:

1. A material comprising cobalt (Co), platinum (Pt) and phosphorus (P),
   wherein the material has a composition of 94-98 wt % Co, wt % Pt being larger than 0 and no larger than 1, and 2-4 wt % P, and
   wherein the cobalt (Co) has a form of a hexagonal close-pack (hcp) and has a 2θ of approximately 44.5° on an X-ray diffraction spectrum.

2. A material comprising cobalt (Co), platinum (Pt) and phosphorus (P),
   wherein the cobalt (Co) has a form of a hexagonal close-pack (hcp) and has a 2θ of approximately 44.5° on an X-ray diffraction spectrum and
   wherein the material has a composition of 96.3 wt % Co, 0.6 wt % Pt and 3.1 wt % P.

3. A material according to claim 1, wherein the material is subjected to annealing at a temperature between 100 and 500 degrees Celsius.

4. A material according to claim 3, wherein the annealing is carried out under ambient atmosphere.

5. A substrate and a material according to claim 1, wherein the material is electroplated on the substrate to form a layer thereon.

6. A substrate and a material according to claim 5, wherein the layer has a thickness of at least 0.5 μ.

7. A substrate and a material according to claim 5, wherein the substrate comprises a seed layer, the seed layer comprising a layer of gold (Au) on a layer of chromium (Cr) (Cr/Au seed layer).

8. A substrate and a material according to claim 7, wherein the gold layer of the Cr/Au seed layer has a (111) crystallographic orientation.

9. A microelectromechanical system (MEMS) device comprising the material according to claim 1.

10. A MEMS device according to claim 9, wherein the MEMS device is a magnetic MEMS device.

11. A MEMS device according to claim 10, wherein the MEMS device is a microgripper.

* * * * *